(12) United States Patent
Wu et al.

(10) Patent No.: US 8,378,382 B2
(45) Date of Patent: Feb. 19, 2013

(54) HIGH ASPECT-RATIO PN-JUNCTION AND METHOD FOR MANUFACTURING THE SAME

(75) Inventors: Chao-I Wu, Hsinchu (TW); Ming Hsiu Lee, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 243 days.

(21) Appl. No.: 11/027,807

(22) Filed: Dec. 30, 2004

(65) Prior Publication Data

US 2006/0145307 A1    Jul. 6, 2006

(51) Int. Cl.
*H01L 29/66* (2006.01)
*H01L 29/861* (2006.01)

(52) U.S. Cl. . 257/104; 257/107; 257/119; 257/E29.327; 257/302

(58) Field of Classification Search ........... 257/E23.147, 257/930, 929, 51, 653, 544, 550, 212, 530, 257/104, 107, 119, E29.327; 438/131, 467, 438/600, 242, 212, 268, 270
See application file for complete search history.

(56) References Cited

U.S. PATENT DOCUMENTS

| | | | | |
|---|---|---|---|---|
| 4,028,149 A * | 6/1977 | Deines et al. | | 117/95 |
| 4,687,879 A * | 8/1987 | Hendricks | | 136/212 |
| 4,876,220 A | 10/1989 | Mohsen et al. | | |
| 5,006,909 A * | 4/1991 | Kosa | | 257/302 |
| 5,065,212 A * | 11/1991 | Ohata et al. | | 257/327 |
| 5,432,739 A * | 7/1995 | Pein | | 365/185.11 |
| 5,581,100 A * | 12/1996 | Ajit | | 257/331 |
| 5,648,283 A * | 7/1997 | Tsang et al. | | 438/138 |
| 5,753,947 A * | 5/1998 | Gonzalez | | 257/296 |
| 6,420,215 B1 | 7/2002 | Knall et al. | | |
| 6,515,343 B1 * | 2/2003 | Shroff et al. | | 257/530 |
| 6,555,848 B2 * | 4/2003 | Yoshitake | | 257/104 |
| 6,566,682 B2 * | 5/2003 | Forbes | | 257/51 |
| 6,903,367 B2 * | 6/2005 | Forbes | | 257/51 |
| 7,345,342 B2 * | 3/2008 | Challa et al. | | 257/341 |
| 2004/0108573 A1 * | 6/2004 | Herner | | 257/530 |
| 2004/0154656 A1 | 8/2004 | Weaver et al. | | |

OTHER PUBLICATIONS

C. Rochefort et al.,"Manufacturing of High Aspect Ratio P-N Junctions Using Vapor Phase Doping for Application in Multi-Resurf Devices," *Proceedings of the 14th International Symposium on Power Semiconductor Devices and ICs*, 2002, pp. 237-240.

* cited by examiner

*Primary Examiner* — Zandra Smith
*Assistant Examiner* — Tsz Chiu
(74) *Attorney, Agent, or Firm* — Stout, Uxa, Buyan & Mullins, LLP

(57) ABSTRACT

A semiconductor device having high-aspect-ratio PN-junctions is provided. The semiconductor device includes a conducting layer. The semiconductor device further includes a plurality of first doped regions formed over the conducting layer. The sidewalls of the doped regions are doped to form PN-junctions. The semiconductor device also includes a plurality of second doped regions over the first doped regions.

15 Claims, 18 Drawing Sheets

HIGH ASPECT-RATIO PN-JUNCTION AND METHOD FOR MANUFACTURING THE SAME

BACKGROUND OF THE INVENTION

The present invention relates generally to a semiconductor devices and, more particularly, to semiconductor devices having PN-junctions with high-aspect ratios. The present invention also relates to the method of manufacturing such semiconductor devices.

Integrated circuit (IC) technology has advanced at a rapid pace over the years. As IC technology advances, the requirements for the basic IC fabrication are becoming more rigorous. The principal factor influencing IC fabrication is the constant demand to reduce the size of the semiconductor devices. Due to this demand, there is a trend toward the use of greater device densities and smaller minimum feature sizes with smaller separations in between.

The basic fabric of the IC technology depends on PN-junctions. The forward bias current of the PN-junction and the PIN (P-region and the N-region separated by an isolation region) of a semiconductor device depend upon the area of the PN-junction. The area of the PN-junction and the forward bias current of the PN-junction are directly proportional to one another. However, the smaller feature size imposed by the present need of the industry, restricts the size of the PN-junction within the semiconductor device. Due to a reduction in size of the PN-junction, the forward bias current is limited, which in turn limits the sense margin of the on-state and the off-state.

In light of the foregoing, there is a need for ICs having PN-junctions and PIN junctions that can withstand a high forward bias current.

SUMMARY OF THE INVENTION

Broadly speaking, the present invention enables PN-junctions with high-aspect ratios that can withstand high forward bias currents.

In accordance with one aspect of the present invention, a semiconductor device with PN-junctions having high-aspect-ratios is provided. The semiconductor device includes a plurality of conducting layers which may act as a bit line or a word line in memory. A plurality of regions associated with a first dopant are formed over the conducting layer and least two side walls of each of the plurality of regions, associated with the first dopant, are doped with a second dopant. A plurality of regions associated with the second dopant are formed over the regions associated with the first dopant.

In accordance with another aspect of the invention a semiconductor device with PN-junctions having high-aspect-ratio is provided. The semiconductor device includes a plurality of conducting layers. The semiconductor device further includes a plurality of regions associated with a first dopant formed over the conducting layer. An isolation-layer is formed over the plurality of regions associated with the first dopant and the conducting layer. Portions of the isolation-layer, lying over at least two sidewalls of the plurality of regions associated with the first dopant, is doped with a second dopant. A plurality of regions associated with the second dopant formed over the regions associated with the first dopant, such that the isolation-layer is separating the regions associated with the first dopant and the regions associated with the second dopant.

In accordance with yet another aspect of the invention, a method for making a semiconductor device having PN-junctions with high-aspect-ratio is provided. The method involves providing a conducting layer. The method further involves forming a plurality of first doped regions over the conducting layer wherein the plurality of first doped regions are defined within four sidewalls. Then, at least two opposing sidewalls of the first doped regions are doped to generate PN-junctions. Thereafter, a plurality of second doped regions are formed over the first doped region.

In accordance with another aspect of the invention, a method for making a semiconductor device having PIN-junctions with high-aspect-ratio is provided. The method includes providing a conducting layer. Next, the operation involves forming a plurality of first doped regions over the conducting layer. The plurality of first doped regions are defined within four walls. Thereafter, an isolation-layer is formed over the plurality of first doped regions and the conducting layer exposed between the plurality of first doped regions. Then, portions of the isolation-layer lying over at least two sidewalls of the plurality of first doped regions are doped with a second dopant. Subsequently, a plurality of second doped regions are formed over the plurality first doped regions where the first doped region and the second doped region are separated by the isolation-layer.

It is to be understood that the foregoing general description and the following detailed description are exemplary and explanatory only and are not restrictive of the invention, as claimed.

BRIEF DESCRIPTION OF THE DRAWINGS

The accompanying drawings, which are incorporated in and constitute part of this specification, illustrate exemplary embodiments of the invention and together with the description serve to explain the principles of the invention.

DETAILED DESCRIPTION OF EXEMPLARY EMBODIMENTS

Several exemplary embodiments of the invention will now be described in detail with reference to the accompanying drawings.

Figure 1:
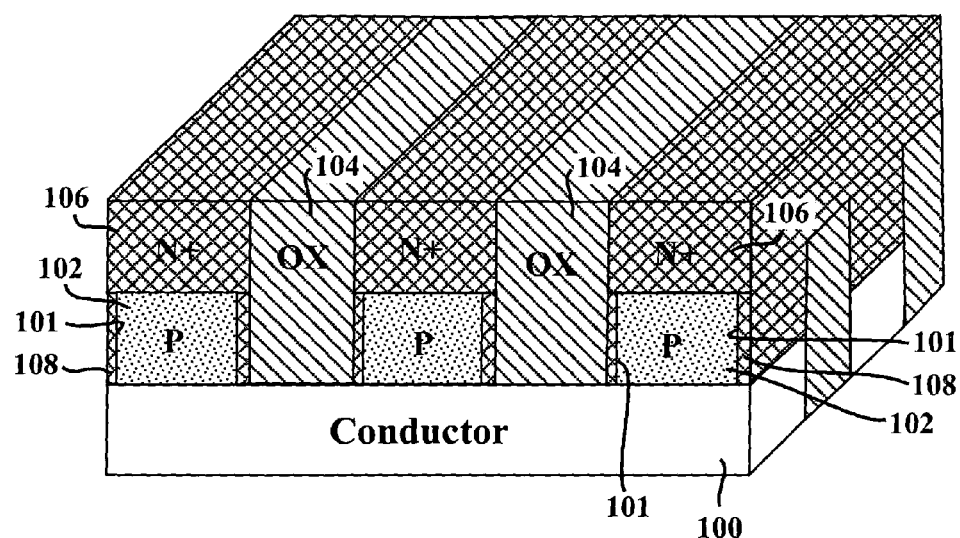
FIG. 1 illustrates top and cross section views of the three-dimensional view of a semiconductor structure having high-aspect-ratio PN-junctions in accordance with an embodiment of the present invention.

In accordance with the present invention, a semiconductor structure having PN-junctions, with high-aspect-ratios that can withstand high forward bias currents is provided. The term "aspect-ratio" refers to the ratio of the width dimension to the height dimension of a particular opening. Here, the aspect ratio is understood to mean the ratio of the width of the PN-junction or the PIN-junction to the height of the PN-junction or the PIN-junction. FIG. 1 is a schematic diagram of a semiconductor structure that is tailored to withstand high forward bias current. FIG. 1 includes a conducting layer 100 and a plurality of P-regions 102 on the upper surface of the conducting layer 100, wherein the P-regions 102 contact the upper surface of the conducting layer 100. The sidewalls 101 of the P-regions 102 are in contact with spacers 108. The spacers 108 are formed by a doped poly silicon spacer process to form PN-junctions. The sidewalls 101 are preferably doped with N+ poly-silicon. FIG. 1 further includes a plurality of N region 106 on the upper surface of the P-region 102. The regions between the spacers 108 and the N region 106 are filled with oxide 104, so that the N and the P regions are isolated. The combination of spacers 108 and the N region 106 provide a high aspect-ratio PN-junction. Such PN-junctions with high aspect-ratio are capable of handling high forward bias currents. They also have increased junction areas that help to reduce the surface field.

It should be understood that the P-regions and the N region are interchangeable. In FIG. 1 for example, the P-regions 102 over conducting layer 100 could be replaced with N region 106. In such cases the sidewalls of the N-region may be doped with P-type poly-silicon to create the PN-junctions.

Figure 2:
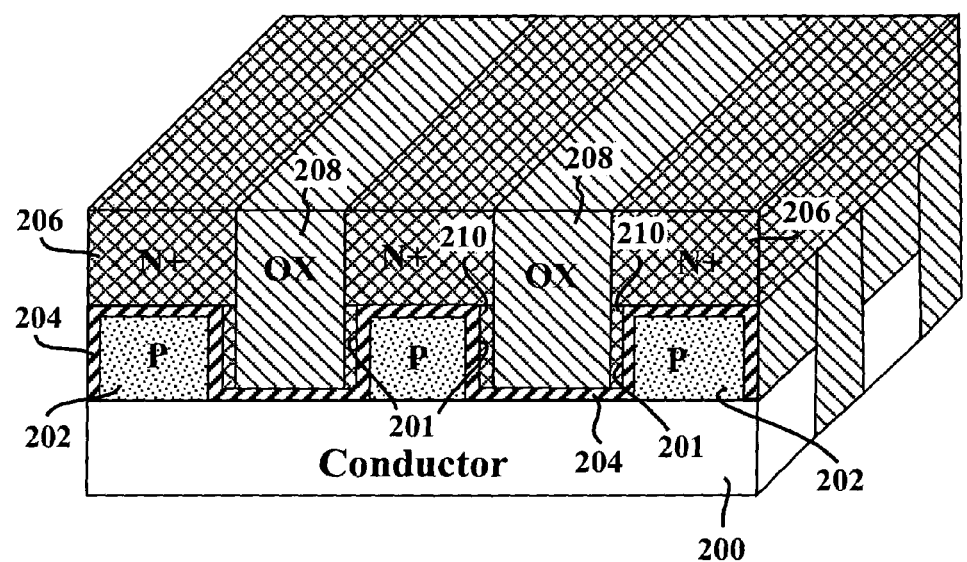
FIG. 2 illustrates top and cross section views of the three-dimensional view of a semiconductor structure having high-aspect-ratio PIN-junctions in accordance with an embodiment of the present invention.

In accordance with the present invention, semiconductor PIN-junctions that can withstand high forward bias currents are provided. FIG. 2 is an alternative embodiment to FIG. 1. FIG. 2 includes a conducting layer 200, and a plurality of P-regions 202 on the upper surface of the conducting layer 200. An isolation-layer 204 is formed over the P-region and the areas in between the P-regions over the conductor 200. The sidewalls 201 of the isolation-layer 204 are in contact with spacers 210. The spacers 210 are formed by a doped poly silicon spacer process to form PIN-junctions. FIG. 2 further includes a plurality of N regions 206 on the upper surface of the P-region 202. The regions between the spacers 210 and the N regions 206 are filled with oxide 208. The combination of spacers 210 and N regions 206 provide a high-aspect-ratio PIN-junction. The high-aspect-ratio PIN junctions are adapted to handle high forward-bias current. Similarly, the high-aspect-ratio PIN-junctions offer an increased junction area that helps to reduce the surface field. Such high aspect-ratio-pin junctions are ideal for memory cells to be used in high-density memory applications.

Figure 3A:
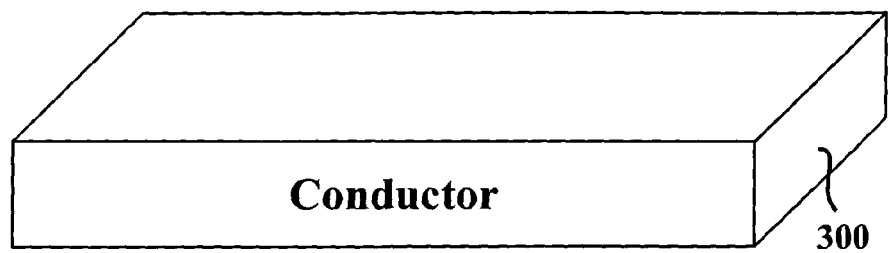
FIGS. 3a-3i are schematic diagrams illustrating a method of manufacturing semiconductor structures having PN-junctions with high-aspect-ratios in accordance with an embodiment of the present invention.
Figure 3B:
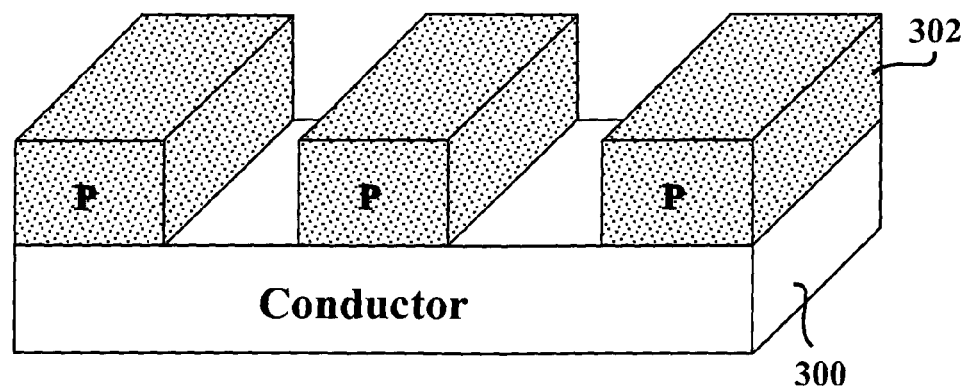
Figure 3C:
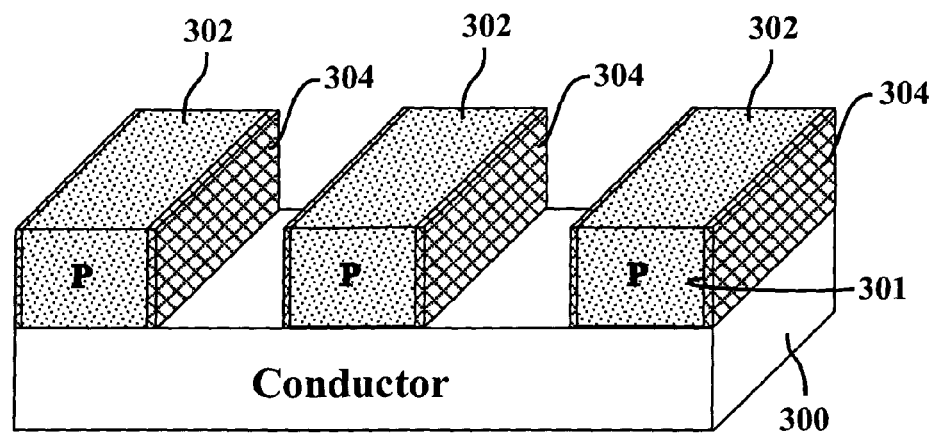
Figure 3D:
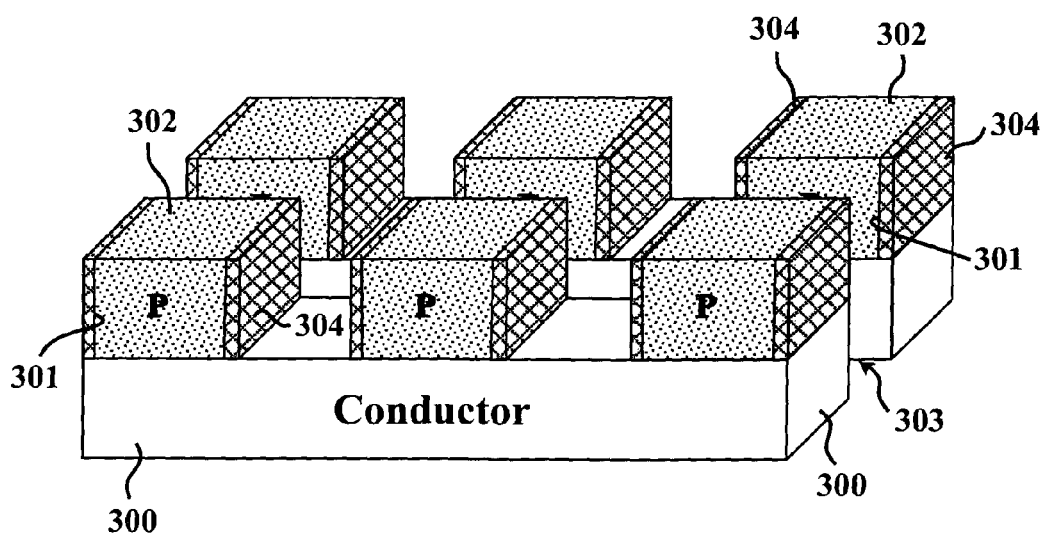
Figure 3E:
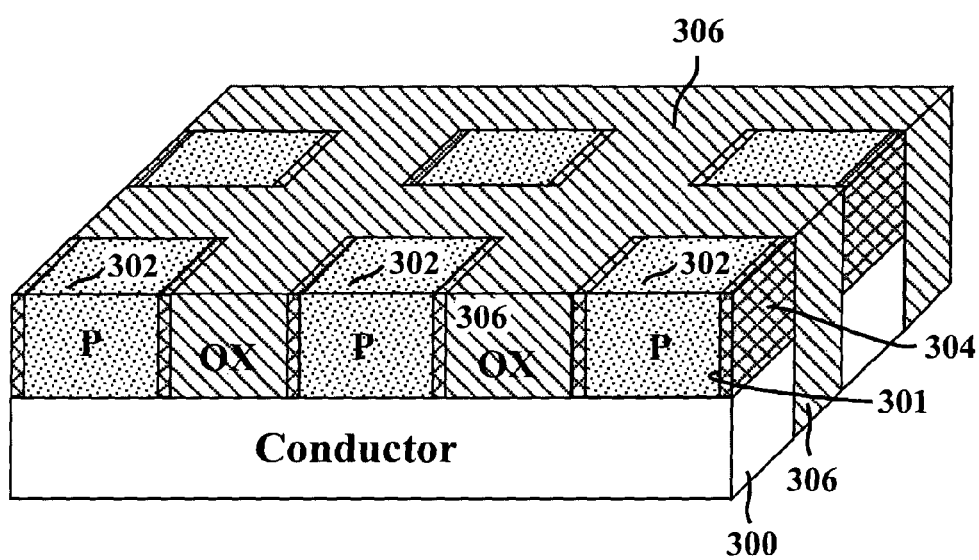
Figure 3F:
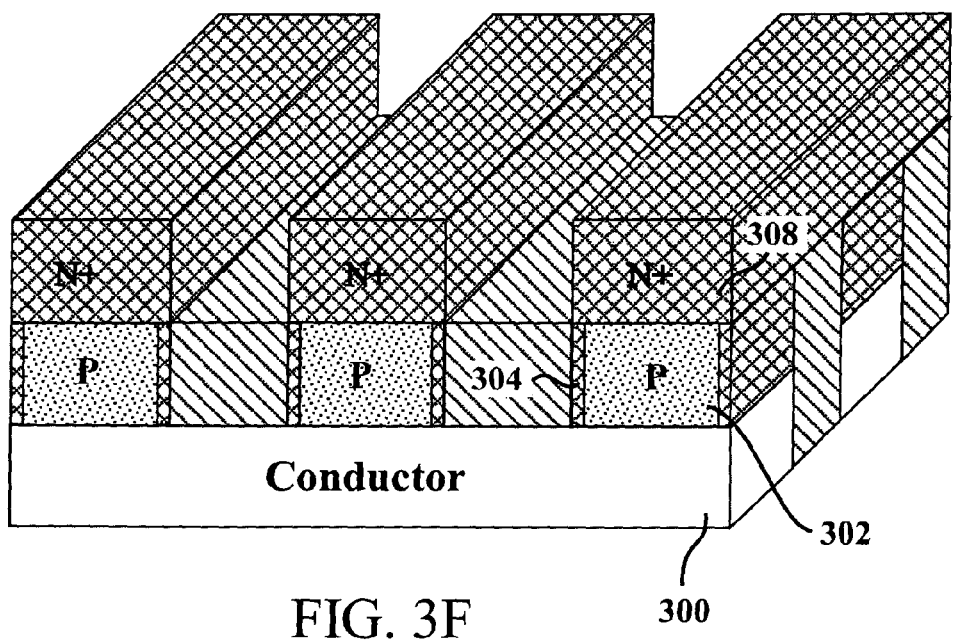

FIGS. 3a through 3i are schematic diagrams for illustrating a method of manufacturing a semiconductor structure having PN-junctions with high-aspect-ratio. In this series of Figures, the semiconductor structure is shown as a memory having word lines and a bit lines as an example. It should be understood that the PN-junctions illustrated here may be implemented in other devices such as a diode, or a transistor. Referring to FIG. 3a, a conductor 300 is provided. A plurality of P-regions 302 are formed on the upper surface of the conductor 300 as shown in FIG. 3B, wherein the P-regions 302 contact the upper surface of the conductor 300 directly. The P-regions 302 may act as a word line in a memory. Thereafter in FIG. 3c, the sidewalls 301 of the P-regions are doped N+ to form a spacer 304. The N+ doping of the sidewalls 301 help to reduce the depletion region. The doping concentration should be at least $1\times10^{18}$ $cm^{-3}$. The sidewalls 301 are doped using a doped poly-silicon spacer process. The spacer 304 thus formed is an N+ poly-silicon spacer and the spacer creates a PN-junction at the sidewalls 301 of the P-regions 302. In FIG. 3d the bit lines are defined as indicated by arrow 303. Any standard semiconductor fabrication process such as pattern etching may be used to define the bit lines. In FIG. 3e, the regions between the spacers 304, the conductor 300, and the P-regions 302 are filled with isolation material 306, such as oxide, nitride, amorphous materials or the like. A plurality of N+ regions 308 are deposited over the P-regions 302 in FIG. 3F. The combination of PN-junctions created by the N+ regions 308 and the PN-junctions formed from the spacers 304 provides a high-aspect ratio PN-junctions which can withstand high forward bias currents. It should be appreciated and understood that the P-region 302 may be interchanged with N+ region 308. However, in this scenario, the sidewalls of the N+ region is doped with P-poly to generate the spacers.

Figure 3G:
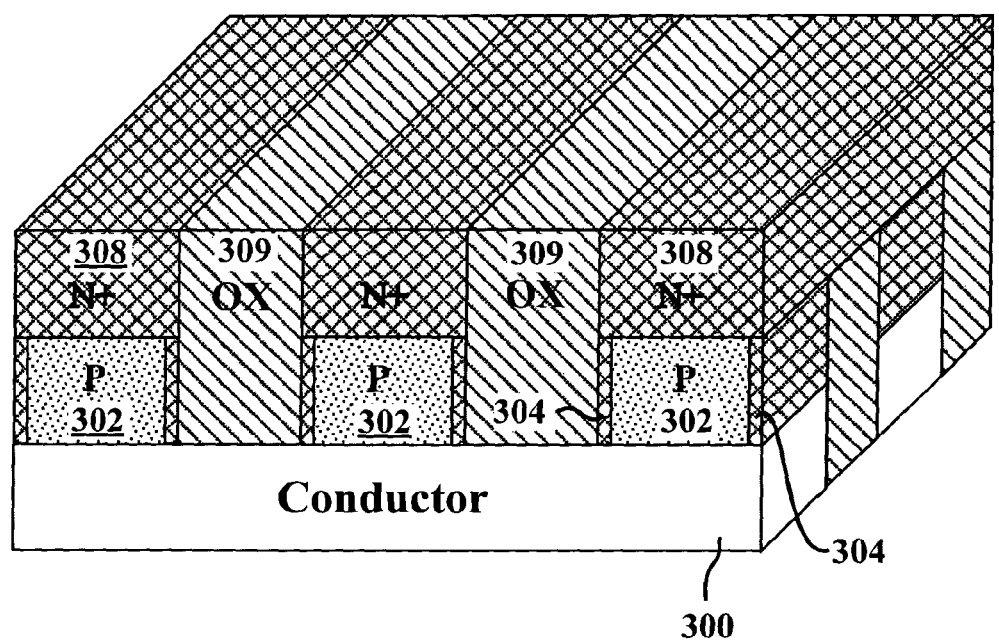
Figure 3H:
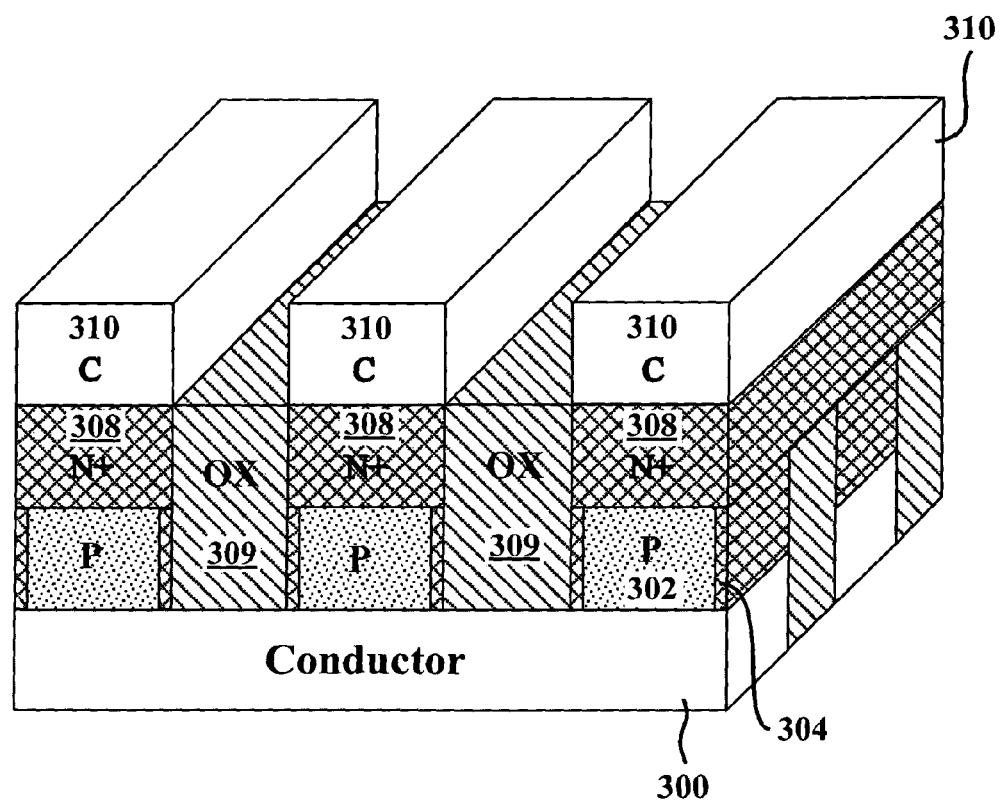
Figure 3I:
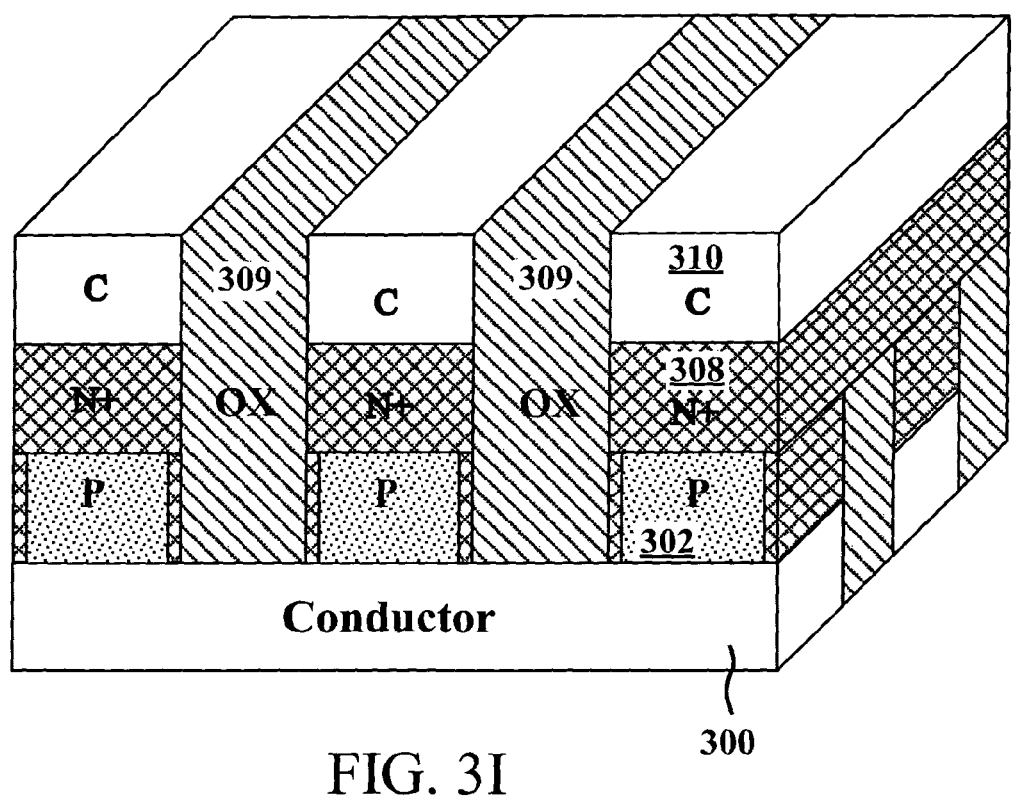

With reference to FIG. 3g, the regions in between the N+ layers are filled with oxide 309. Thereafter, a plurality of conducting lines 310 are deposited defining the word lines as shown in FIG. 3h. FIG. 3i shows the regions between the conducting layers filled with oxide 309. The doped-poly-spacer 304 provides uniform doping profiles. The doped-poly-spacer also provides larger PN-junction areas.

Figure 4A:
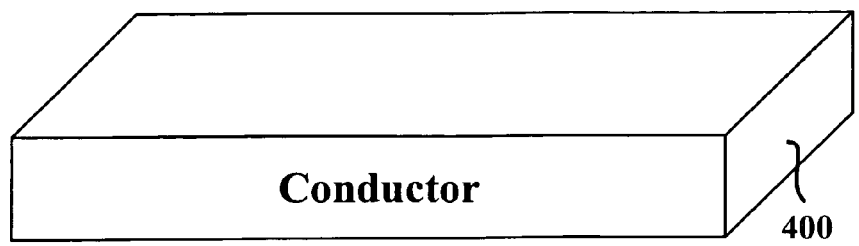
FIGS. 4a-4h are schematic diagrams illustrating a method of manufacturing semiconductor structures having PIN-junctions with high-aspect-ratio in accordance with an embodiment of the present invention.
Figure 4B:
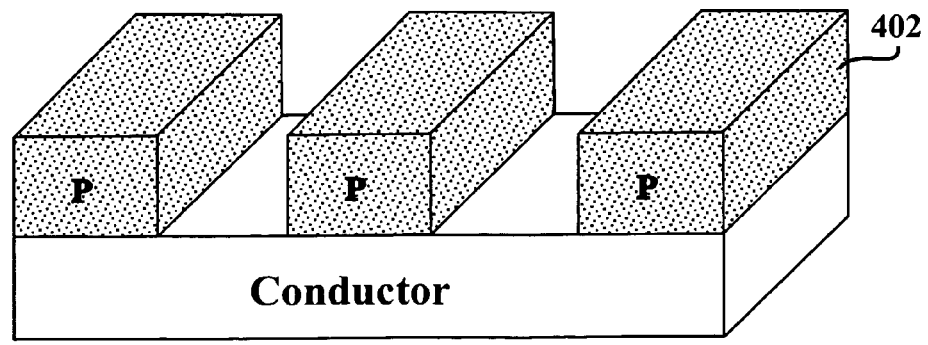
Figure 4C:
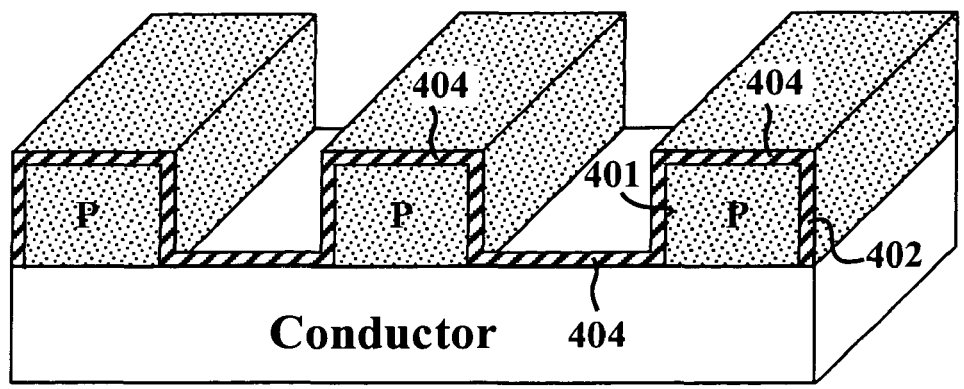
Figure 4D:
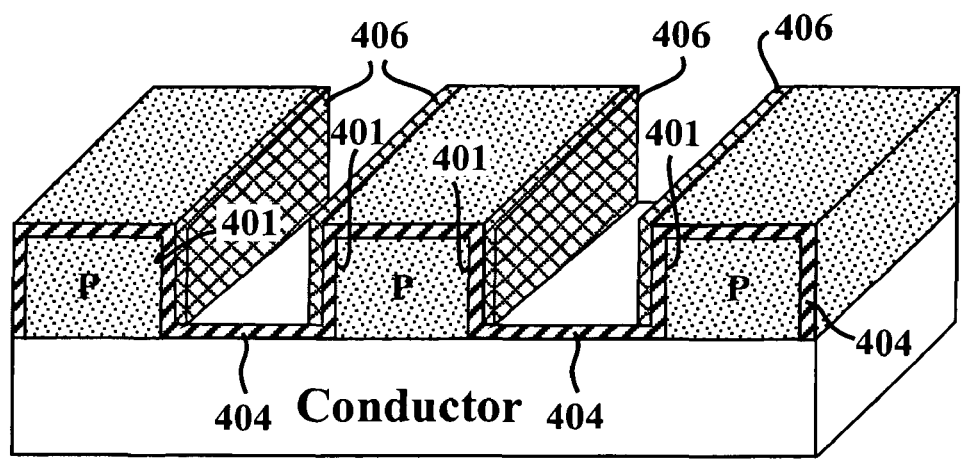
Figure 4E:
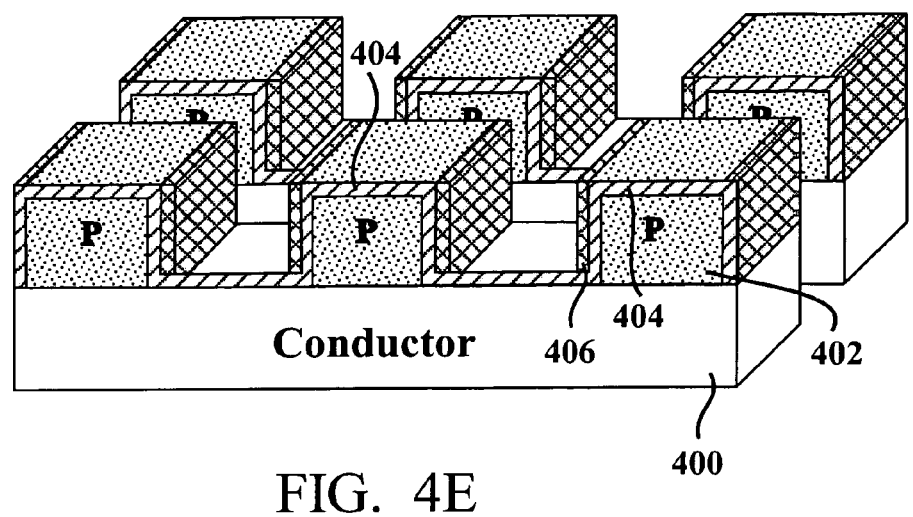
Figure 4F:
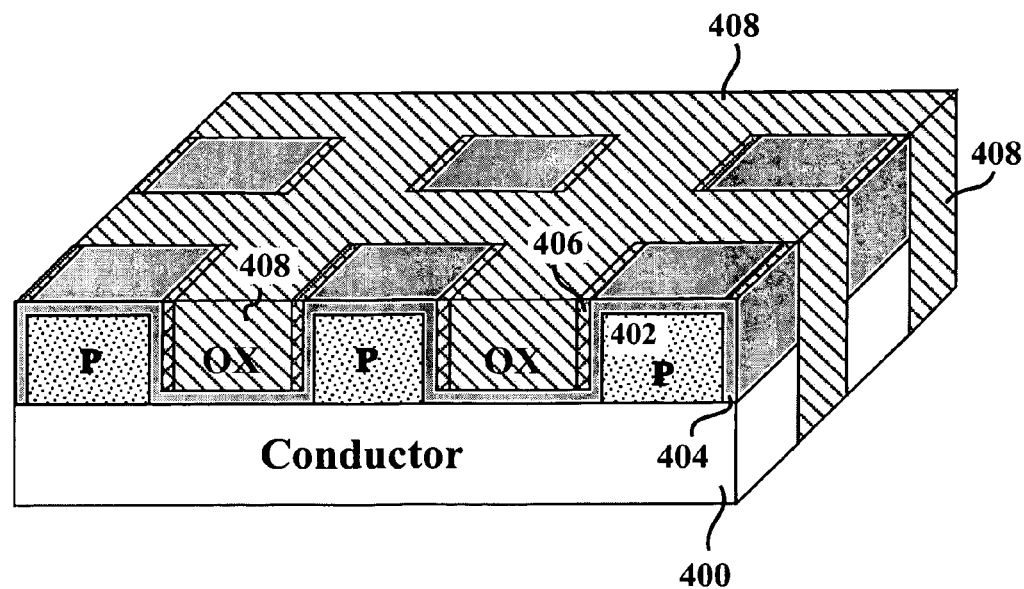
Figure 4G:
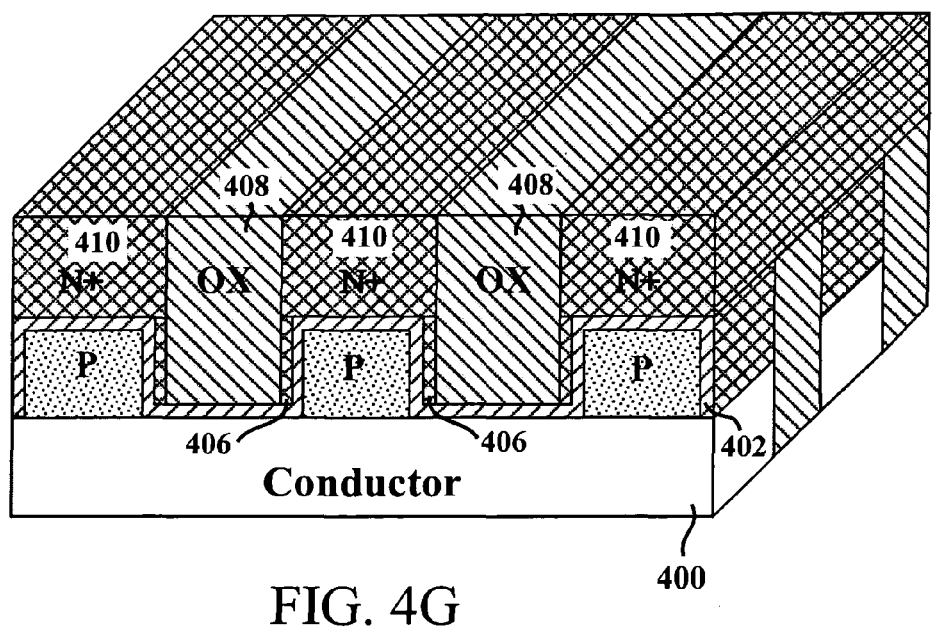
Figure 4H:
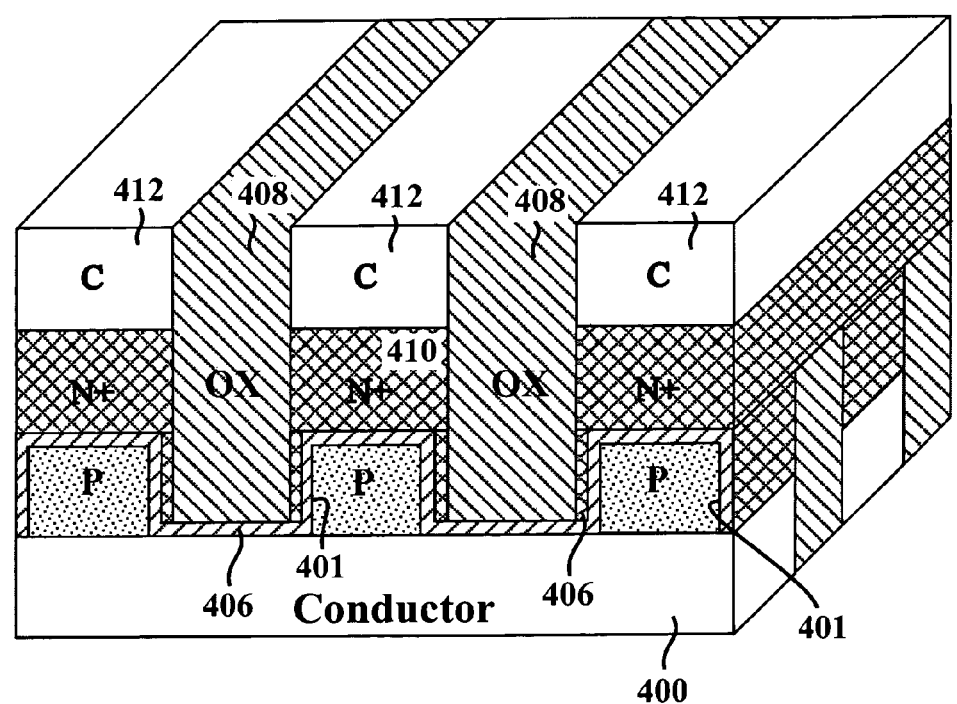

FIGS. 4a-4h are schematic diagrams that illustrate a method of manufacturing a semiconductor structure having PIN-junctions with high-aspect-ratio. FIG. 4a shows a conductor 400. A plurality of P-regions 402 is formed on the upper surface of the conductor 400 as shown in FIG. 4b. An isolation layer 404, is deposited over the P-region and the areas in between the P-regions over the conductor 400 as illustrated in FIG. 4c. The isolation layer 404 covers the upper surface of the P-region 404 and the upper surface of the conductor 400 in between the P-regions. The isolation layer 404 may be composed of oxide, nitride, amorphous material, or the like. Similar to FIGS. 3a-3i, the series of FIGS. 4a-4h are illustrated here in connection with memory word lines and bit lines. However, it should be understood that the method might be used to manufacture other semiconductor devices that require PIN-junctions with high aspect ratios. As such, FIG. 4c further illustrates defining a p-poly-silicon mask. In one embodiment, the isolation layer 404 consists of antifuse oxide such as $SiO_2$, $Si_3N_4$, and $Al_2O_3$ etc. Thereafter, in FIG. 4d, the isolation-layer 404 covering the sidewalls 401, is doped to form N+ poly-silicon spacers 406. In FIG. 4e, the bit line direction is defined. Subsequently, the regions between the poly-silicon spacers 406, the P-regions, and the conductor are filled with oxide 408 as illustrated in FIG. 4f. Then, N+ material 410 is deposited over the P-regions and the regions in between the N+ regions are filled with oxide 408 as illustrated in FIG. 4g. In FIG. 4h, a plurality of conducting layers 412 are deposited over the N+ regions 410 defining the word line direction. Once again, the regions between the conducting layers 412 are filled with oxide 408.

Figure 5A:
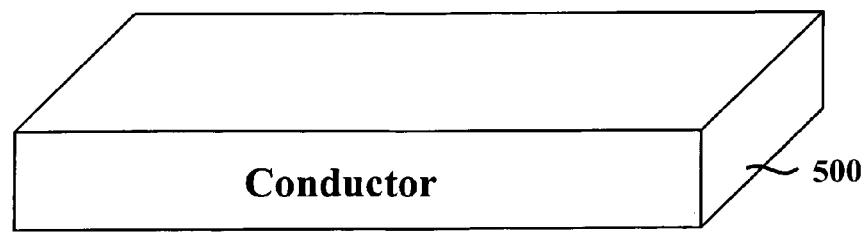
FIGS. 5a-5g are schematic diagrams illustrating a method of manufacturing a semiconductor structure having PN-junctions with high-aspect-ratios in accordance with an embodiment of the present invention.
Figure 5B:
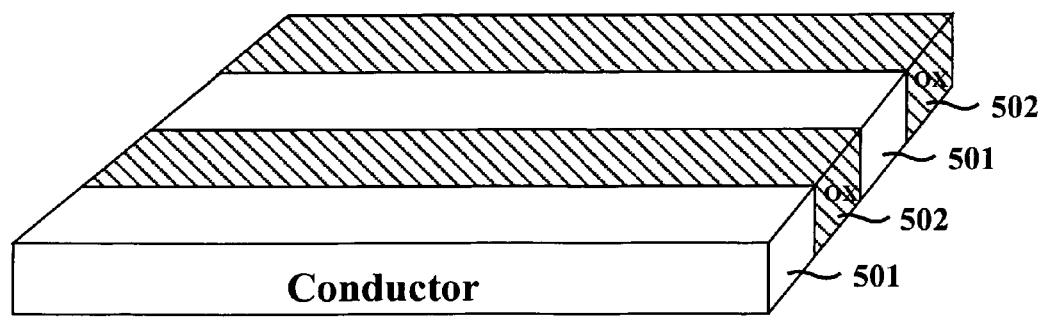
Figure 5C:
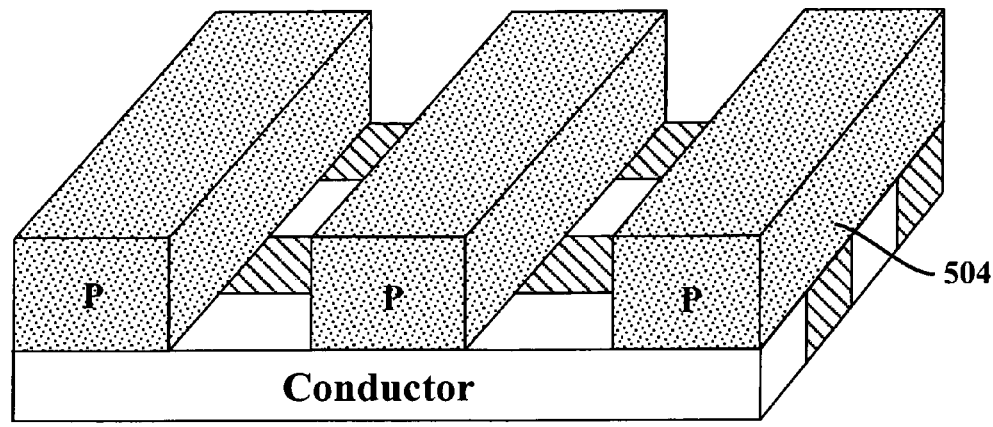
Figure 5D:
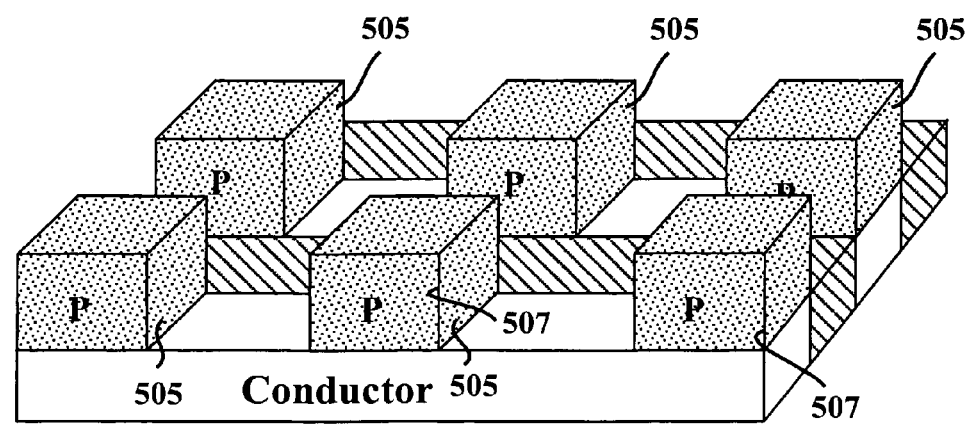
Figure 5E:
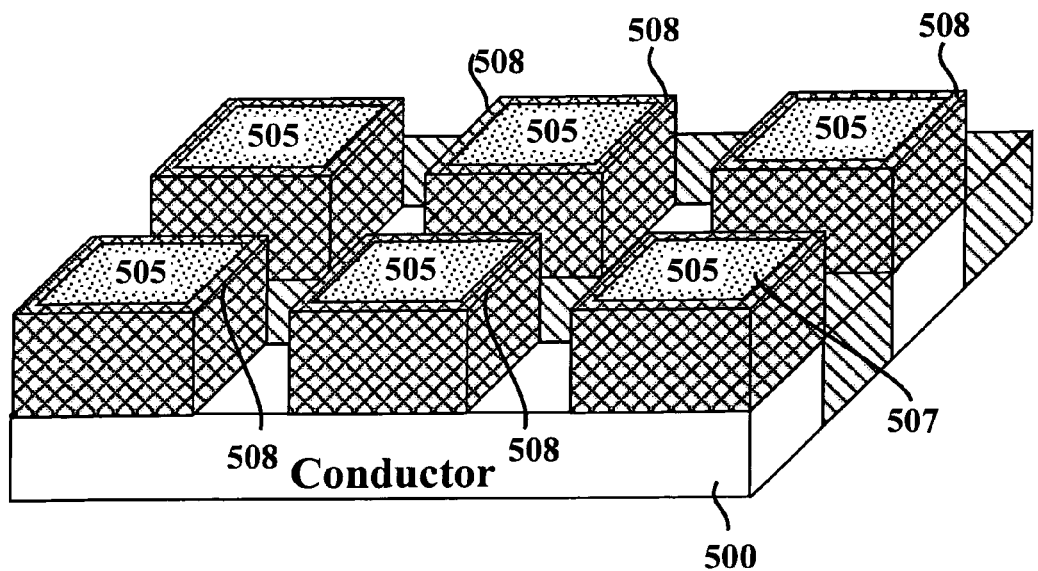
Figure 5F:
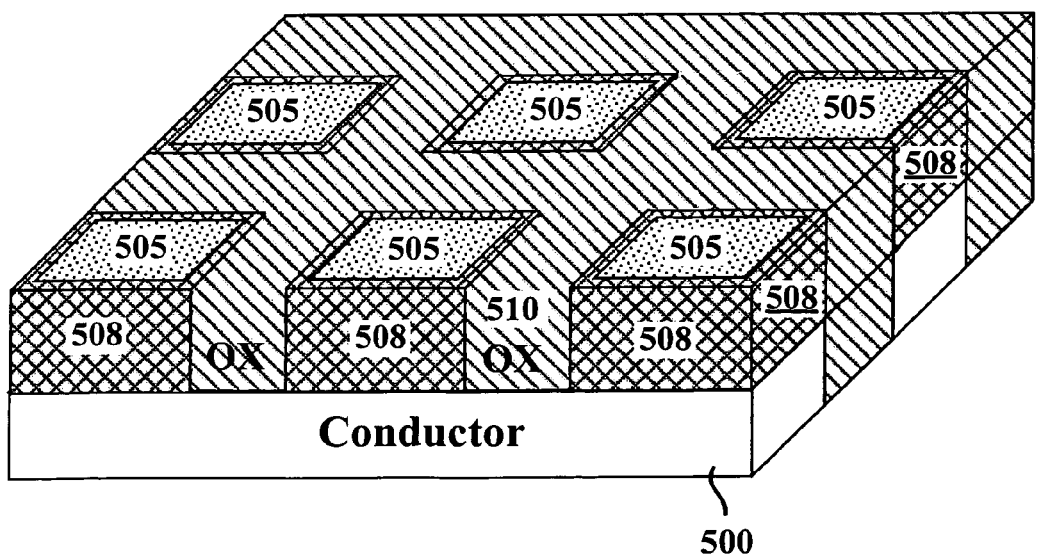
Figure 5G:
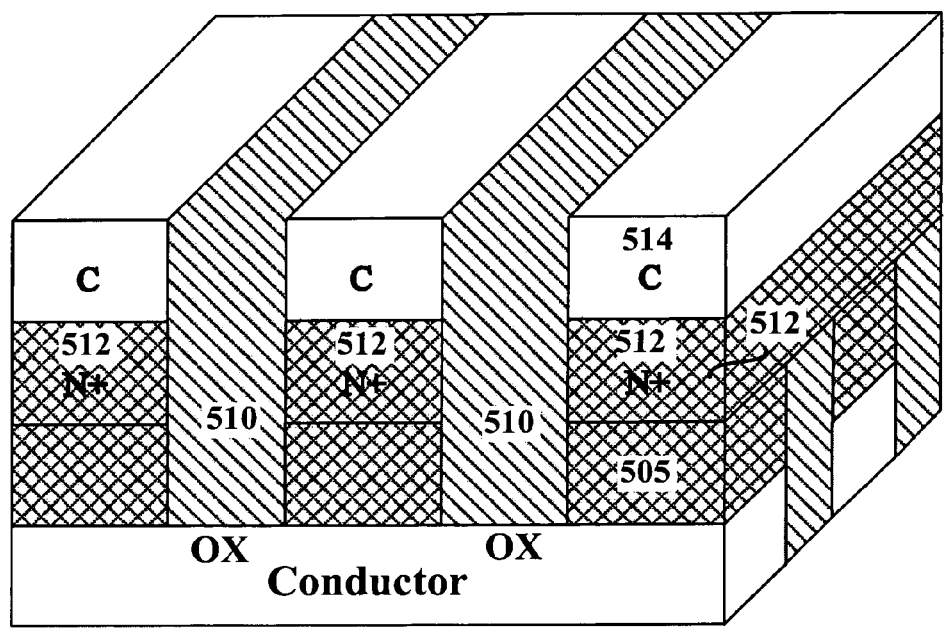

FIGS. 5a-5g are schematic diagrams for illustrating a method of manufacturing a semiconductor structure having PN-junctions with high-aspect-ratio in accordance with another embodiment of the invention. In FIG. 5a, a conductor 500 is provided. Next, in FIG. 5b, a plurality of conducting lines 501 are defined from conductor 500. The conducting lines 501 are separated by oxide regions 502. Thereafter, a plurality of p-layers 504 are formed on the conducting lines 501 and the oxide regions 502 as shown in FIG. 5c. The P-layers 504 are of P-poly-silicon material and is used to define the bit lines. In one embodiment, the P-poly-silicon material is formed by doping poly-silicon with $BF_2$. The P-layers are then etched to form a plurality of P-regions 505 on the conducting lines 501 as shown in FIG. 5d. After that as illustrated in FIG. 5e, all four sidewalls 507 of the P-regions 505 are doped to form N+ poly-silicon spacers 508. Consequently, PN-junctions are formed on all four sidewalls of the P-regions 505. Then the method proceeds in a similar manner as described above with respect to FIGS. 3a-3i, that is, filling the regions in between with oxide after each operation. The method also includes, forming a plurality of N+ regions 512 on the P-regions 505, followed by forming conducting layers 514 on the N+ regions to define word lines. The combination of spacers 508 and the N+ regions 512 with the P-regions 505 provide a high aspect-ratio PN-junction. Such PN-junctions with high aspect-ratios are capable of handling high forward bias current. They also have an increased junction area, that helps to reduce the surface field.

In summary, the present invention provides a semiconductor structure with high-aspect-ratio PN-junctions and PIN-junctions that can withstand high forward bias currents. The structures described here are ideal for next generation memory devices that require a high density and reduced size.

The invention has been described herein in terms of several exemplary embodiments. Other embodiments of the invention will be apparent to those skilled in the art from consideration of the specifications and practice of the invention. The embodiments and preferred features described above should be considered exemplary, with the scope of the invention being defined by the appended claims and their equivalents.

What is claimed is:

1. A semiconductor device comprising:
   a conducting layer;
   a plurality of first regions associated with a first dopant over the conducting layer, wherein each of the first regions has at least two sidewall spacers of a second dopant and the at least two sidewalk comprise four sidewalls and the sidewall spacers are in direct contact with first regions to form PN-junctions; and
   a plurality of second regions associated with the second dopant formed over the first regions to position the first regions between the conducting layer and the second regions.

2. The semiconductor device of claim 1, wherein the first regions are P-regions and the second regions are N-regions.

3. The semiconductor device of claim 1, wherein the first regions are N-regions and the second regions are P-regions.

4. The semiconductor device of claim 1, further comprising:
   a plurality of gaps defined between the first regions and filled with isolation material.

5. The semiconductor device of claim 4, wherein the isolation material is composed of oxide.

6. The semiconductor device of claim 1, further comprising:
   a plurality of gaps defined between the second regions; and
   a plurality of regions disposed within the gaps defined between the second regions and filled with isolation material.

7. The semiconductor device of claim 1, wherein the first dopant is of N+ type.

8. A semiconductor device comprising:
   a conducting layer;
   a plurality of regions associated with a first dopant formed on the upper surface of the conducting layer;
   an isolation layer formed over the plurality of regions associated with the first dopant, the isolation-layer being formed over at least two sidewalls of the plurality of regions associated with the first dopant, is doped with a second dopant, wherein the isolation layer covers the upper surface of the regions associated with the first dopant and the upper surface of the conducting layer in between the regions associated with the first dopant; and
   a plurality of regions associated with the second dopant formed over the regions associated with the first dopant such that the isolation-layer separates the plurality of regions associated with the first dopant and corresponding regions associated with the second dopant, wherein each of the plurality of regions associated with the first dopant corresponds to one of the plurality of regions associated with the second dopant to form a PIN-junction that is operable as a memory cell.

9. The semiconductor device of claim 8, further comprising:
   a plurality of isolation regions separating both the first doped regions, and the second doped regions.

10. The semiconductor device of claim 8, wherein the plurality of regions associated with the first dopant are P-regions and the plurality of regions associated with the second dopant are N-regions.

11. The semiconductor device of claim 8, wherein the plurality of regions associated with the first dopant are N-regions and the plurality of regions associated with the second dopant are P-regions.

12. The semiconductor device of claim 8, wherein the isolation regions are composed of oxides.

13. The semiconductor device of claim 8, wherein the isolation regions are composed of antifuse oxide.

14. The semiconductor device of claim 8, wherein the at least two sidewalk comprise four sidewalls.

15. A semiconductor device comprising:
   a conducting layer;
   a plurality of first regions associated with a first dopant over the conducting layer, wherein each of the first regions has at least two sidewall spacers of a second dopant and the at least two sidewalls comprise four sidewalk and the sidewall spacers contact to the first regions with a first dopant to increase forward current; and
   a plurality of second regions associated with the second dopant formed over the first regions to position the first regions between the conducting layer and the second regions.

* * * * *